United States Patent [19]

Kishi

[11] Patent Number: 5,535,442
[45] Date of Patent: Jul. 9, 1996

[54] FM TUNER HAVING IMPROVED TUNING SPEED

[75] Inventor: Kazuhiro Kishi, Hanno, Japan

[73] Assignee: Kabushiki Kaisha Kenwood, Tokyo, Japan

[21] Appl. No.: 462,055

[22] Filed: Jun. 5, 1995

Related U.S. Application Data

[63] Continuation of Ser. No. 168,206, Dec. 17, 1993, abandoned.

[30] Foreign Application Priority Data

Dec. 25, 1992 [JP] Japan ................... 4-357951

[51] Int. Cl.⁶ .................................. H04B 1/16
[52] U.S. Cl. .................... 455/134.1; 455/160.1; 455/161.2; 455/161.3; 455/186.1; 455/205
[58] Field of Search ................. 455/186.1, 186.2, 455/185.1, 184.1, 160.1, 161.2, 166.1, 166.2, 161.1, 161.3, 182.1, 182.2, 183.2, 205, 45

[56] References Cited

U.S. PATENT DOCUMENTS 4,727,591  2/1988  Manlove .
5,220,682  6/1993  Tomohiro ................ 455/186.1
5,222,254  6/1993  Verron et al. ........... 455/186.1
5,239,681  8/1993  Parnall et al. .......... 455/186.1
5,345,607  9/1994  Liman et al. ........... 455/186.1

FOREIGN PATENT DOCUMENTS 0403744  12/1990  European Pat. Off. ........ 455/186.1
0508369  10/1992  European Pat. Off. .
3504066   8/1986  Germany .................. 455/186.1
0062921   3/1989  Japan ..................... 455/186.1
2213229   8/1990  Japan .
0291724  12/1990  Japan ..................... 455/186.1
0034630   2/1991  Japan ..................... 455/186.1

Primary Examiner—Reinhard J. Eisenzopl
Assistant Examiner—Doris To
Attorney, Agent, or Firm—Sixbey, Friedman, Leedom & Ferguson; Gerald J. Ferguson, Jr.; Eric J. Robinson

[57] ABSTRACT

An FM tuner capable of speeding up an AF search and a PTY search. A tuning operation by the FM tuner with an RDS demodulator is continuously controlled until a tuning is decided in accordance with a tuning signal outputted from a detector or a count of an intermediate frequency. The FM tuner has an AF search designating key for designating an AF search, a PTY designating key for designating a PTY search, and a changeover unit for switching to the tuning signal for the decision of a tuning when the AF or PTY search is designated.

2 Claims, 4 Drawing Sheets

FM TUNER HAVING IMPROVED TUNING SPEED

This application is a Continuation of Ser. No. 08/168,206, filed Dec. 17, 1993, now abandoned.

BACKGROUND OF THE INVENTION

1. Field of the Invention

The present invention relates to an FM tuner with an RDS (Radio Data System) demodulator in which a tuning is decided from a count of an intermediate frequency. More particularly, the invention relates to an FM tuner which decides a tuning from a tuning signal (hereinafter called an SD signal) in an alternative frequency search (hereinafter called an AF search) and in a program type search (hereinafter called a PTY search).

2. Related Background Art

The present applicant has proposed an FM tuner in which instead of the SD signal generated in the tuner, the value of an intermediate frequency counted for a predetermined period is used as a parameter for the decision of a tuning and the tuning operation is continuously controlled until a tuning is decided. Specifically, as shown in FIG. 4, during the tuning operation, the receiving frequency is raised, and the intermediate frequency is counted for a predetermined period, e.g., for 80 nsec if the SD signal has a low potential, i.e., if a tuning is indicated, and the tuning is finally decided if the checked count value of the intermediate frequency corresponds to the value of the intermediate frequency of 10.7 MHz ±15 kHz. If the SD signal has a high potential or if the checked count value does not correspond to the value of the intermediate frequency of 10.7 MHz ±15 kHz, the receiving frequency is again raised.

By counting the intermediate frequency to decide a tuning and control the tuning operation, it becomes possible to prevent an erroneous judgement of a tuning decided by the SD signal because of noises during the tuning operation, and to provide a stable and highly precise tuning control in real time and always at the maximum sensitivity.

However, in the case of an AF search or PTY search by a conventional FM tuner with an RDS demodulator which decides a tuning from the count value, it takes a long time to perform the AF search or PTY search.

SUMMARY OF THE INVENTION

It is an object of the present invention to provide an FM tuner capable of speeding up an AF search and PTY search.

According to one aspect of the present invention, there is provided an FM tuner having an RDS demodulator in which a tuning operation is continuously controlled until a tuning is decided in accordance with a tuning signal outputted in a tuner circuit or a count of an intermediate frequency, the FM tuner having AF search designating means for designating an AF search, and changeover means for switching to the tuning signal for the decision of a tuning when the AF search is designated.

According to another aspect of the present invention, there is provided an FM tuner having an RDS demodulator in which a tuning operation is continuously controlled until a tuning is decided in accordance with a tuning signal outputted in a tuner circuit or a count of an intermediate frequency, the FM tuner having PTY search designating means for designating a PTY search, and changeover means for switching to the tuning signal for the decision of a tuning when the PTY search is designated.

In the FM tuner of the present invention, when an AF search is designated by an AF search designating unit, a tuning decision is switched from that by an intermediate frequency to that by the tuning signal outputted in the tuner circuit. Accordingly, it is not necessary to count the intermediate frequency, speeding up the AF search.

When an PTY search is designated by a PTY search designating unit, a tuning decision is switched from that by an intermediate frequency to that by the tuning signal outputted in the tuner circuit. Accordingly, it is not necessary to count the intermediate frequency, speeding up the PTY search.

DETAILED DESCRIPTION OF THE PREFERRED EMBODIMENTS

An embodiment of an FM tuner according to the present invention will be described with reference to the accompanying drawings.

Figure 1:
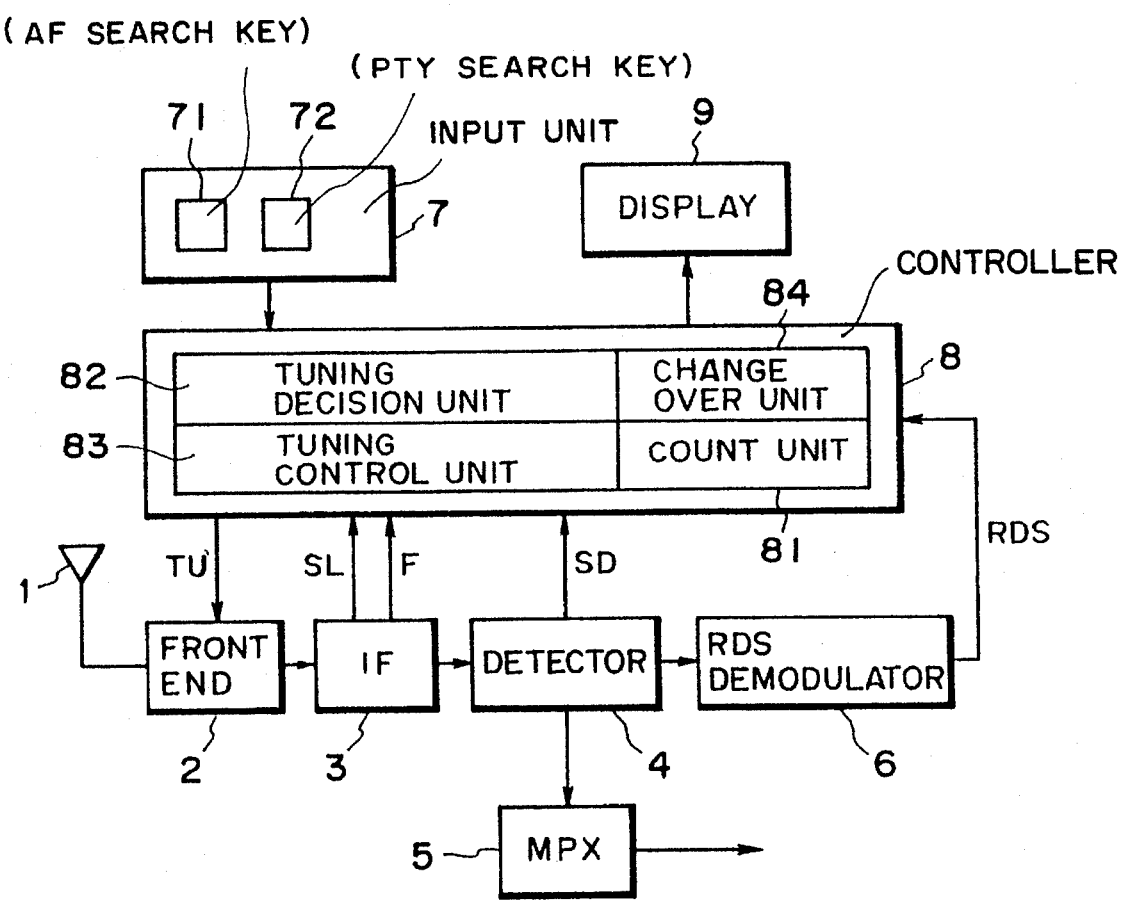
FIG. 1 is a block diagram of an FM tuner according to an embodiment of the present invention.

FIG. 1 is a block diagram showing the structure of the FM tuner according to the embodiment of the invention.

Radio signals received by an antenna 1 are supplied to a front end 2. The front end 2 selects a radio signal having a desired frequency, amplifies it, and converts the radio signal frequency into an intermediate frequency. The front end 2 has a tuner and a local oscillator whose tuning frequency and oscillation frequency are controlled by a supplied tuning signal TU to perform a tuning operation for the radio frequency.

An intermediate frequency outputted from the front end 2 is amplified by an intermediate frequency amplifier IF 3 while clamping its amplitude. The intermediate frequency amplifier 3 outputs an electric field strength or signal level SL corresponding to the electric field strength of the received radio frequency, and also outputs a count pulse F obtained by wave-shaping the intermediate frequency signal.

An intermediate frequency signal outputted from the intermediate frequency amplifier 3 is supplied to a detector 4 and FM-detected by the detector 4 which outputs a tuning signal SD. An output of the detector 4 is stereo-demodulated by a stereo demodulator MPX 5 and outputted therefrom as right and left audio signals.

An output of the detector 4 is also supplied to an RDS (Radio Data System) demodulator 6 to demodulate an RDS signal which is supplied to a controller 8 for the synchronous reproduction and error correction of RDS data.

The controller 8 made of a microcomputer receives the count pulse F, signal level SL, SD signal, and RDS data, and outputs the tuning signal TU. The controller 8 is connected to an input unit 7 and a display 9. The input unit 7 includes keys for designating a receiving frequency, an AF search key 71 for designating an AF search, and a PTY search key 72 for designating a PTY search. An output of the input unit 7 is supplied to the controller 8 to control the FM tuner, and necessary data is displayed on the display 9.

The controller 8 functionally includes a counter unit 81 for counting the count pulse F outputted from the intermediate frequency amplifier, a tuning decision unit 82 for deciding a tuning, a tuning control unit 83 for controlling the tuning operation by changing the tuning signal until the tuning is decided, and a changeover unit 84 for switching between the SD signal and the count of the counter unit 81 in response to a signal from the input unit 7, the selected one being used for deciding a tuning.

The operation of the embodiment constructed as above will be described with reference to the flow charts shown in FIGS. 2 and 3, the operation being sequentially controlled by programs stored in the controller 8.

Figure 4:
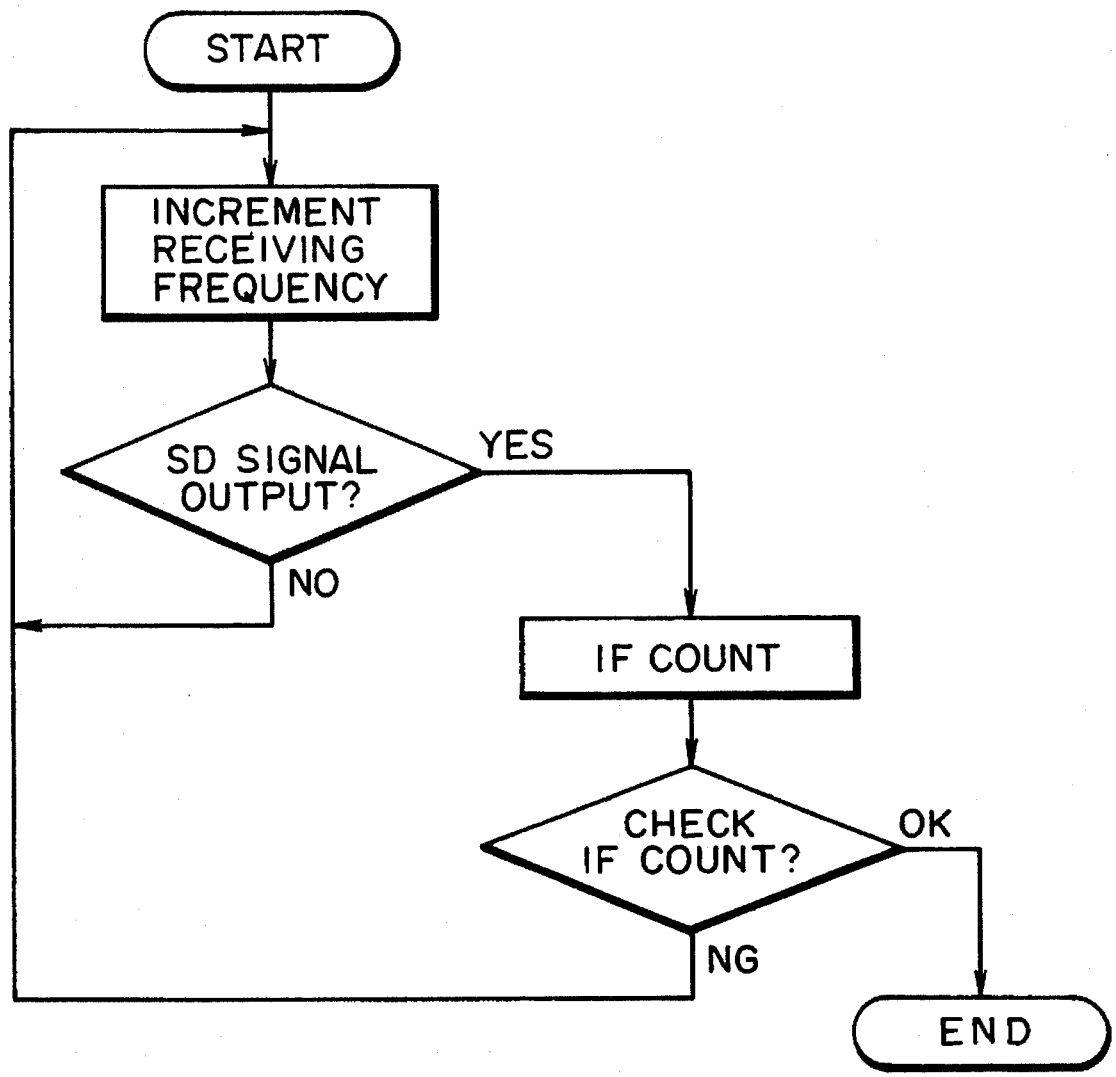
FIG. 4 is a flow chart explaining the operation of a conventional FM tuner.

When a receiving frequency is keyed in from the input unit 7, the changeover unit 84 is switched to the count of the counter unit 81 to decide a tuning. In this case, the count pulse F is counted until it reaches a predetermined value, i.e., until a tuning is decided, while sequentially changing the tuning signal TU. In this manner, the tuning operation shown in FIG. 4 is executed.

An RDS broadcast station transmits AF data indicating the frequencies of other broadcast stations transmitting the same program. Receiving AF data, the FM tuner updates an AF list and stores it. In the case of an AF search, the broadcast station having the strongest electric field is selected by searching frequencies of the AF list.

Figure 2:
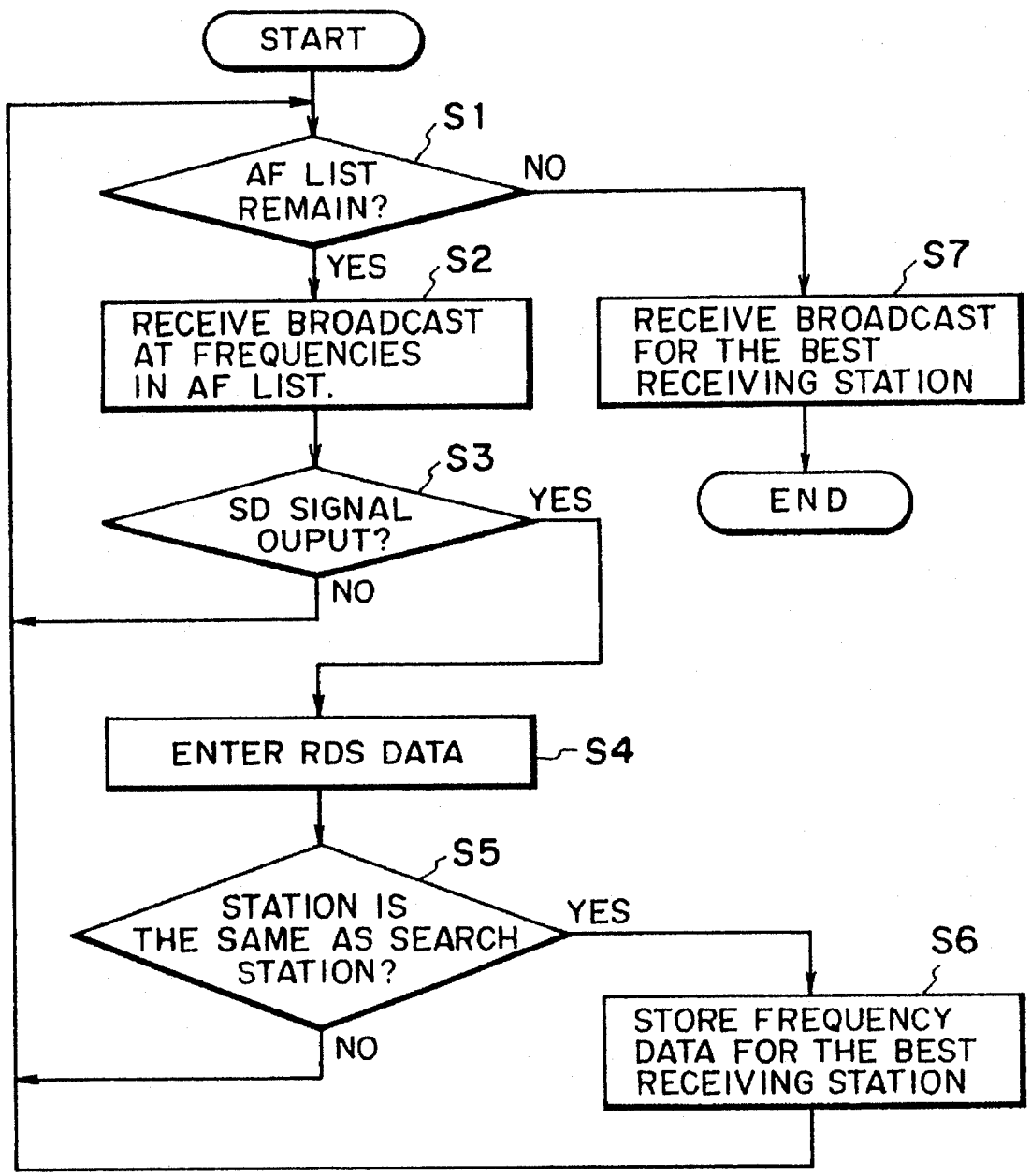
FIG. 2 is a flow chart explaining the operation of the FM tuner of the embodiment.

When an AF search is keyed in by the AF search key 71 of the input unit 7, as shown in FIG. 2, it is checked whether there is any frequency remained unchecked in the AF list (Step S1). If there is a remaining frequency, the tuning signal TU is set so as to receive this remaining frequency (Step S2).

Thereafter, it is checked whether the SD signal is being outputted (Step S3), i.e., whether the tuning has completed. If not outputted, i.e., if not completed, the control returns to Step S1.

If it is judged at Step S3 from the SD signal that the tuning has been completed, RDS data is received (Step S4) to check whether the present station transmits the same program as the station immediately before the AF search designation. Whether the present station transmits the same program or not is determined from a program identification code (PI code) contained in the RDS data.

If it is judged not as the same program, the control returns to Step S1. If it is judged as the same program, the frequency of the broadcast station having the strongest signal level SL, i.e., the frequency of the best receiving station, is retained (Step S6). The control then returns to Step 1 to repeat the above operations until all the frequencies in the AF list have been checked.

If it is judged at Step S1 that all the frequencies in the AF list have been checked, the tuning operation for the broadcast station having the strongest signal level SL retained at Step S6 is performed to receive the program from this station (Step S7), thereafter terminating the AF search.

In the AF search, the AF data indicating particular frequency data and the PI code identifying the same program are used. Therefore, the tuning operation can be executed correctly by using the SD signal without counting the count pulse F for the decision of a tuning. Since the counting time is not needed, the AF search can be performed in a shorter time.

An RDS broadcast station also transmits a program type code PTY discriminating between programs such as news, serious music, dramas, and sports. A PTY search provides a function of searching a particular broadcast station in accordance with the PTY code. In this PTY search, the same PTY code as a user selected PTY code is searched from all RDS broadcast stations in the frequency band receivable by the FM tuner, and the program is received from the searched RDS broadcast station.

Figure 3:
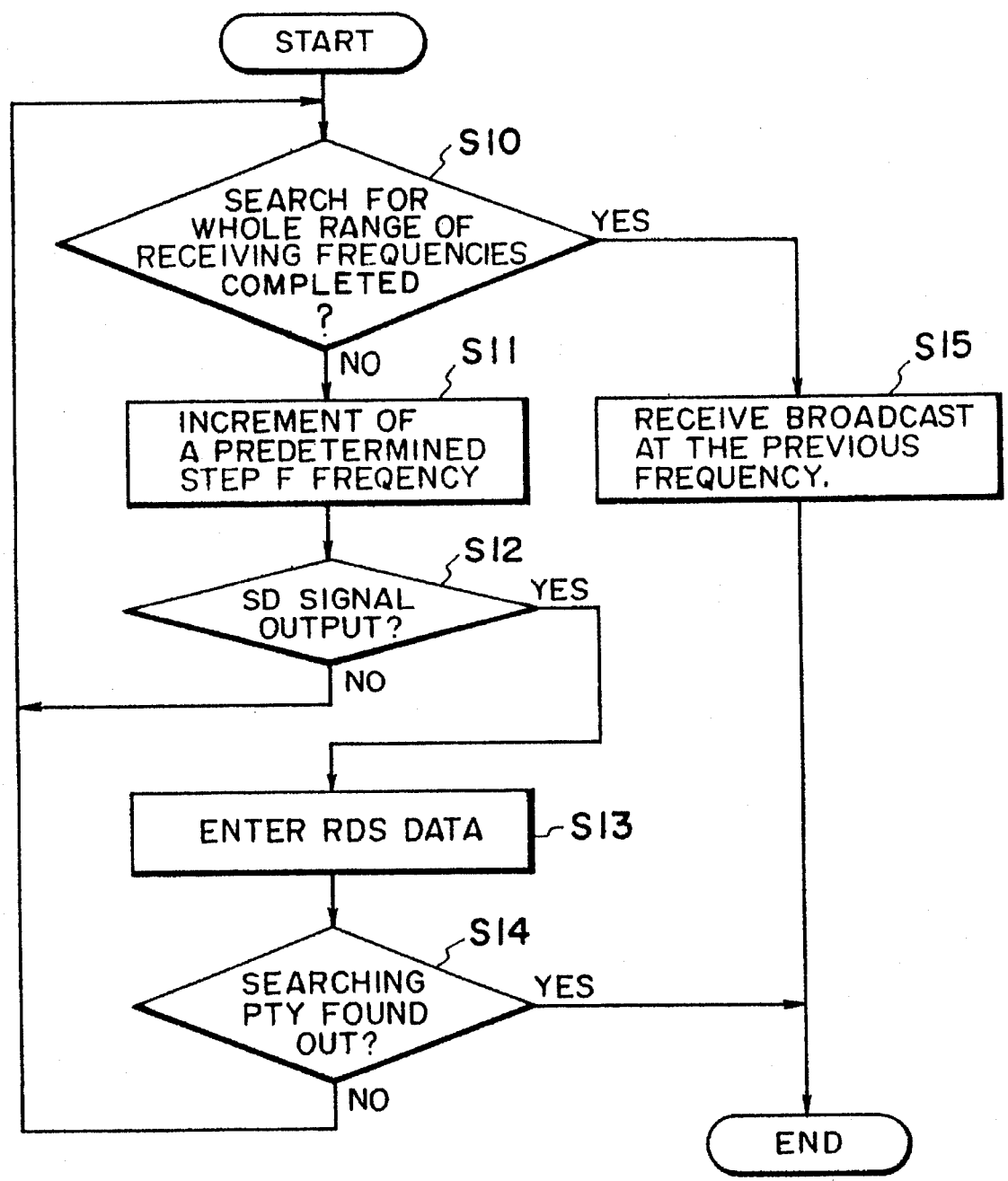
FIG. 3 is a flow chart explaining the operation of the FM tuner of the embodiment.

When a PTY search is keyed in by the PTY search key 72 of the input unit 7, as shown in FIG. 3, it is checked whether the whole receivable frequency band has been searched (Step S10). If not searched, the tuning signal TU representative of a frequency incremented by a predetermined step of frequency is outputted, the incremented tuning signal TU continuing to be outputted until a tuning is decided (Step S11). The predetermined step may be 50 kHz or 100 kHz.

It is then checked whether the SD signal is being outputted (Step S12). If not, the control returns to Step S10, whereas if outputted at Step S12, the RDS data is received (Step S13) to check whether the tuned RDS broadcast station has the same PTY code as the searching PTY code (Step S14).

If the tuned RDS broadcast station has not the same PTY code, the control returns to Step S10, whereas if it has the same PTY code, the PTY search is terminated.

If no RDS broadcast station having the same PTY code is found regardless of searching the whole receivable frequency band, the RDS broadcast immediately before the PTY search is tuned in (Step S15), thereafter terminating the PTY search.

As above, also in the PTY search, a tuning is decided by using the SD signal, thereby shortening the tuning time more than by counting the count pulse.

In the PTY search, the tuning frequency is incremented by the predetermined step as explained with Step S11, eliminating the erroneous judgement to be caused by the precision of the SD signal. According to the regulations, adjacent RDS broadcast stations are not permitted to operate at the frequency interval of 50 kHz. Therefore, the predetermined step may be set to 100 kHz, without any practical problem regarding the precision of the SD signal.

As seen from the foregoing description, the FM tuner of this invention decides a tuning by using the SD signal in the AF and PTY searches, allowing to speed up the searches.

What is claimed is:

1. An FM tuner comprising a tuner circuit (2) controlled by a tuning signal (TU); an intermediate frequency amplifier (3) for amplifying an intermediate frequency signal, a detector (4) for demodulating a FM signal in the intermediate frequency signal amplified by said intermediate frequency amplifier to generate a tuning indicating signal (SD), control means in response to a first search signal which indicates that said tuner circuit sequentially tunes to unknown receiving radio frequencies (8) for taking a count (F) of the frequency in the intermediate frequency signal when the tuning indicating signal (SD) is generated and in accordance with the count rendering said tuner circuit tuned to a receiving radio frequency signal, and means (7) for generating a second search signal which indicates that said tuner circuit sequentially tunes to a plurality of receiving radio frequencies previously stored in a list, wherein said control means in response to the second search signal controls said tuner circuit in accordance with a tuning indicating signal (SD) from said detector without using the count.

2. An FM tuner according to claim 1 having a radio data system demodulator wherein said second search signal indicates an alternative frequency search or program type search.

* * * * *